United States Patent
Hudait et al.

(10) Patent No.: US 7,868,318 B2
(45) Date of Patent: Jan. 11, 2011

(54) QUANTUM WELL FIELD-EFFECT TRANSISTORS WITH COMPOSITE SPACER STRUCTURES, APPARATUS MADE THEREWITH, AND METHODS OF USING SAME

(75) Inventors: Mantu Hudait, Portland, OR (US); Robert S. Chau, Beaverton, OR (US); Marko Radosavljevic, Beaverton, OR (US); Ravi Pillarisetty, Portland, OR (US); Gilbert Dewey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 243 days.

(21) Appl. No.: 12/291,231

(22) Filed: Nov. 7, 2008

(65) Prior Publication Data

US 2010/0117062 A1    May 13, 2010

(51) Int. Cl.
    *H01L 31/00* (2006.01)
(52) U.S. Cl. .................. 257/19; 257/E21.403; 438/172
(58) Field of Classification Search .................. 257/14, 257/19, E21.403, E29.069, E29.072; 438/172
    See application file for complete search history.

(56) References Cited

U.S. PATENT DOCUMENTS

| | | |
|---|---|---|
| 2008/0029756 A1 | 2/2008 | Hudait et al. |
| 2008/0073639 A1 | 3/2008 | Hudait et al. |
| 2008/0076235 A1 | 3/2008 | Hudait et al. |
| 2008/0132081 A1 | 6/2008 | Shaheen et al. |
| 2008/0157058 A1 | 7/2008 | Hudait et al. |
| 2008/0210927 A1* | 9/2008 | Hudait et al. .................. 257/14 |
| 2008/0227246 A1* | 9/2008 | Chiu et al. .................. 438/172 |

OTHER PUBLICATIONS

Selmic et al. ("Design and characterization of 1.3-micron AlIn-GaAs-InP multiple-quantum-well lasers," IEEE J. Sel. Topics Quantum Electron., vol. 7, No. 2, pp. 340-349, Mar.-Apr. 2001).*

* cited by examiner

*Primary Examiner*—Thomas L Dickey
(74) *Attorney, Agent, or Firm*—John N. Greaves

(57) ABSTRACT

A quantum well (QW) layer is provided in a semiconductive device. The QW layer is covered with a composite spacer above QW layer. The composite spacer includes an InP spacer first layer and an InAlAs spacer second layer above and on the InP spacer first layer. The semiconductive device includes InGaAs bottom and top barrier layers respectively below and above the QW layer. The semiconductive device also includes a high-k gate dielectric layer that sits on the InP spacer first layer in a gate recess. A process of forming the QW layer includes using an off-cut semiconductive substrate.

18 Claims, 6 Drawing Sheets

QUANTUM WELL FIELD-EFFECT TRANSISTORS WITH COMPOSITE SPACER STRUCTURES, APPARATUS MADE THEREWITH, AND METHODS OF USING SAME

TECHNICAL FIELD

A variety of electronic and optoelectronic devices use thin film relaxed lattice constant III-V semiconductors on semiconductive substrates such as elemental silicon (Si) substrates. Surface layers capable of using the properties of III-V materials may host a variety of high performance electronic devices such as complementary metal oxide semiconductor (CMOS) and quantum well (QW) transistors. The growth of III-V materials upon silicon substrates, however, presents many challenges. Crystal defects are generated by phenomena such as lattice mismatch, polar-on-nonpolar mismatch, and thermal mismatch between the III-V semiconductor epitaxial layers and the semiconductive substrate. Such mismatch can lead to substandard electrical characteristics such as inadequate carrier mobility and unacceptable leakage. When the lattice mismatch between the epitaxial layer and substrate exceeds a few percent, the strain induced by the mismatch may become too great and defects may be generated in the epitaxial layer when the epitaxial film relaxes the lattice mismatch strain. Many defects, such as threading dislocations and twins, tend to propagate into the device layer where the semiconductive device is fabricated.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

In various embodiments, indium gallium arsenide (InGaAs)-based semiconductor devices are formed on a semiconductive substrate such as silicon. Using such an InGaAs-based structure, high speed and low power performance can be realized. Such architectures include composite spacer that allows for a high dielectric constant (high k) gate dielectric for use with a metal gate.

Figures 1A, 1B:
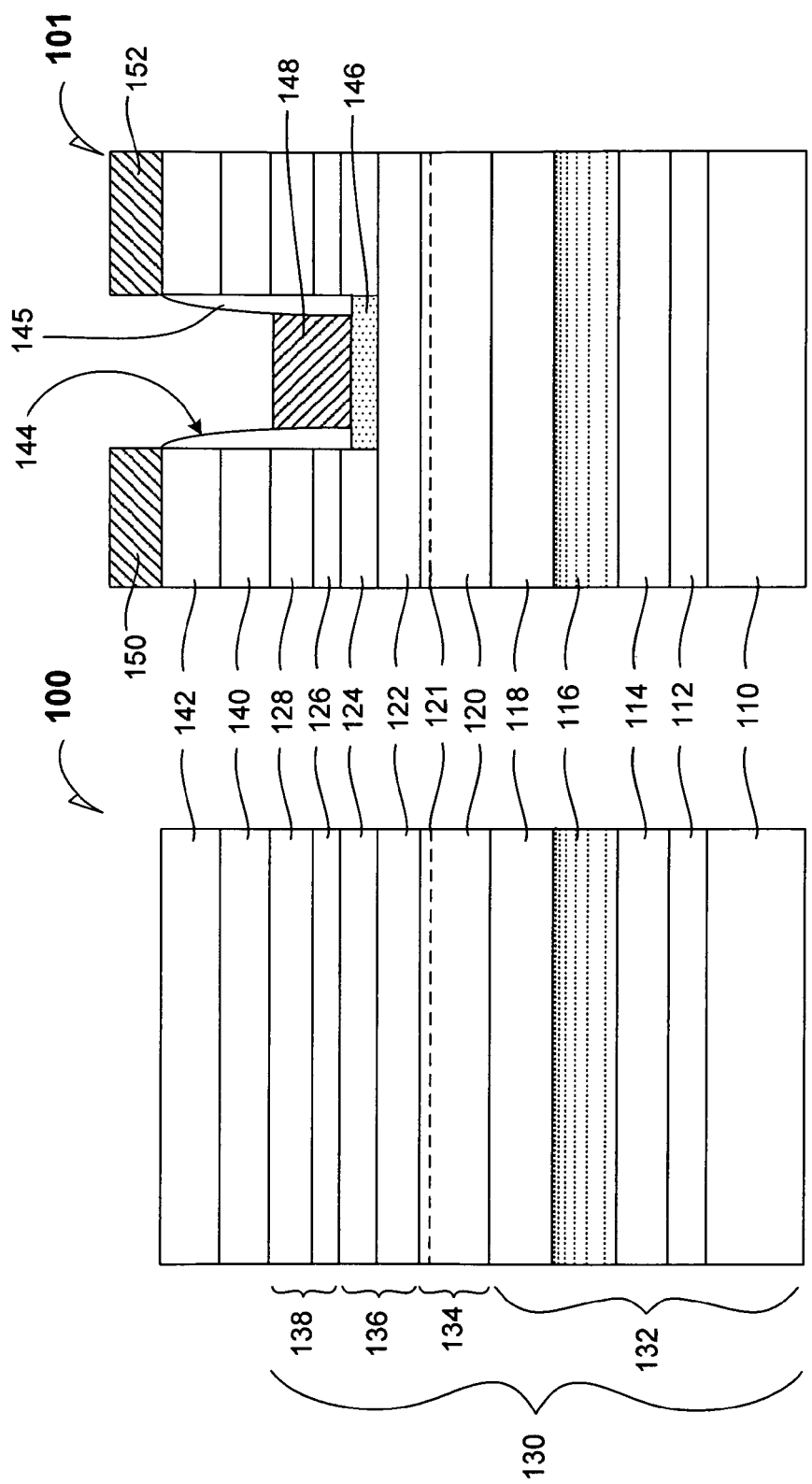
FIG. 1a is a cross-section elevation of an integrated circuit device according to an example embodiment.
FIG. 1b is a cross-section elevation of the integrated circuit device depicted in FIG. 1a after further processing according to an embodiment.

FIG. 1a is a cross-section elevation of an integrated circuit device 100 according to an example embodiment. The integrated circuit device 100 may be used to form an NMOS or PMOS device on a semiconductive substrate 110. In an embodiment, the semiconductive substrate 110 is a high resistivity n or p-type (100) off-oriented Si substrate. In an embodiment, the semiconductive substrate 110 has a vicinal surface that is prepared by off-cutting the semiconductive substrate 110 from an ingot. The (100) semiconductive substrate 110 is off cut at an angle between 2 and 8 degrees towards the [110] direction to produce a surface that may have terraces according to an embodiment. In an embodiment different off-cut orientations are used. In an embodiment, the semiconductive substrate 110 is provided without an off-cut orientation. In any event, an off-cut semiconductive substrate 110 or other substrate preparation may provide for device isolation and may also reduce anti-phase domains in antiphase boundaries. The semiconductive substrate 110 may have a resistivity in a range from 1 ohm ($\Omega$) to 50 k$\Omega$.

A nucleation layer 112 and bottom buffer layer 114 are formed on the semiconductive substrate 110. In an embodiment, the nucleation layer 112 is made of gallium arsenide (GaAs). In an embodiment, the nucleation layer 112 is formed by a metal organic chemical vapor deposition (MOCVD) process. In an embodiment, the nucleation layer 112 is formed by a molecular beam epitaxy (MBE) process. Other processes many be used to form the nucleation layer 112. In an embodiment, the nucleation layer is a 30 nanometer (nm) thick layer of GaAs, followed by the bottom buffer layer 114 that can be from 0.3 micrometer ($\mu$m) to 1 $\mu$m. The nucleation- and buffer layers 112 and 114, respectively are used to fill the lowest semiconductive substrate terraces with atomic bi-layers of III-V materials such as GaAs material. The nucleation layer 112 portion of nucleation- and bottom buffer layers 112 and 114 may create an anti-phase domain-free "virtual polar" substrate. In an embodiment, MBE is carried out at temperatures between 400° C. and 500° C. The bottom buffer layer 114 of the nucleation- and bottom buffer layer 112 and 114 respectively may provide for gliding dislocation and control of the lattice mismatch of between 4% to 8% between the semiconductive substrate 110 and a barrier layer to be formed over the nucleation- and bottom buffer layers 112 and 114. In an embodiment, the bottom buffer layer 114 is formed at a higher temperature than the nucleation layer 112. Further in an embodiment, the bottom buffer layer 114 is relatively thicker.

The nucleation layer 112 and the bottom buffer layer 114 are configured to form a dislocation filtering buffer that can provide compressive strain for an InGaAs quantum well (QW) structure as set forth below. The nucleation layer 112 and the bottom buffer layer 114 may be configured to control lattice mismatch of about 4% to minimize threading dislocations.

Further processing is depicted in FIG. 1a where a graded buffer layer 116 is formed over the bottom buffer layer 114. In an embodiment, the graded buffer layer 116 is indium aluminum arsenide ($In_xAl_{1-x}As$). Grading proceeds from x equals zero to x equals 0.52. Grading is shown with an increasingly dense composition illustration to represent the increasing presence of indium in an example embodiment. Consequently, the composition at the interface between the bottom buffer layer 114 and the graded buffer layer 116, begins as aluminum arsenide (AlAs) and finishes at the other boundary thereof as $In_{0.52}Al_{0.48}As$. In an embodiment, grading is done linearly by perturbing an indium supply in a linearly increasing manner until reaching what is known to achieve the composition of $In_{0.52}Al_{0.48}As$. In an embodiment, the indium supply is provided in a non-linearly inceasing manner such that the graded buffer layer 116 may have one of a greater- or a lesser-than-half concentration of indium at the physical midpoint of this graded buffer layer. By forming the graded buffer layer 116, dislocations may glide along relatively diagonal planes therewithin. In an embodiment, the graded buffer layer 116 has a thickness between 0.5 and 2.0 μm. In an embodiment, the graded buffer layer 116 has a thickness of 0.8 μm.

In an embodiment, the graded buffer layer 116 is inverse step graded InAlAs in order to have a larger bandgap for device isolation. In an embodiment, the graded buffer layer 116 is inverse step graded indium gallium aluminium arsenide (InGaAlAs) in order to have a larger bandgap for device isolation. The composition may begin with indium present and be completely absent at the top surface. The presence of aluminum may modulate strain on a quantum well layer depending upon the amount of aluminum in the composition of the graded buffer layer 116. The graded buffer layer 116 may also act as a dislocation filtering buffer.

After formation of the graded buffer layer 116, a bottom barrier layer 118 is formed. In an embodiment, the bottom barrier layer 118 is formed of a higher bandgap material than what will be a quantum well layer to be formed above and on the bottom barrier layer 118. In an embodiment, the bottom barrier layer 118 is of sufficient thickness to provide a potential barrier to charge carriers in structures that are forming a transistor stack 130. In an embodiment, the bottom barrier layer 118 has a thickness between 4 nm and 16 nm. In an embodiment, the bottom barrier layer 118 has a thickness of 10 nm.

After formation of the bottom barrier layer 118, a quantum well (QW) layer 120 is formed. In an embodiment, the QW layer 120 is formed of a material that has a smaller bandgap than that of the bottom barrier layer 118. In an embodiment, the QW layer 120 is formed of $In_xGa_{1-x}As$, where x equals between 0.53 and 0.8. The QW layer 120 may be of sufficient thickness to provide adequate channel conductance for a given application such as a transistor for a memory cell. The QW layer 120 may be of sufficient thickness to provide adequate channel conductance for a given application such as a transistor for a logic circuit. In an embodiment, the QW layer 120 is between 4 nm and 16 nm. In an embodiment, the QW layer 120 has a thickness of 10 nm. The QW layer 120 may provide high electron mobility and velocity for NMOS devices, and also may provide high hole mobility and velocity for PMOS devices, both compared to a silicon-based device.

In an embodiment, a composite spacer 136 is formed over the QW layer 120. The composite spacer 136 includes an InP spacer first layer 122 and an $In_{0.52}Al_{0.48}As$ spacer second layer 124. As further shown in FIG. 1a, the composite spacer 136 is formed over the QW layer 120. The composite spacer 136 may provide for carrier confinement and reduced interaction between a doping layer and a two dimensional electron gas (2DEG) 121 formed inside the channel of the QW layer 120. The 2DEG 121 is depicted as a dashed line within the QW layer 120. The composite spacer 136 may also provide compressive strain to the QW layer 120 as it acts as a semiconductive channel. In an embodiment, the InP spacer first layer 122 has a thickness in a range from 0.5 nm to 4 nm. In an embodiment, the $In_{0.52}Al_{0.48}As$ spacer second layer 124 has a thickness in a range from 1.5 nm to 6 nm. In an embodiment, the InP spacer first layer 122 has a thickness of 2 nm and the $In_{0.52}Al_{0.48}As$ spacer second layer 124 has a thickness of 3 nm.

After forming the composite spacer 136, a doping layer 126 is formed. In an embodiment, doping is selected based upon the sheet carrier concentration that is useful in the channel of the quantum well 120. An example concentration is $6 \times 10^{12}$ cm$^{-2}$ for a silicon doping layer 126, when doping inside the channel of the quantum well 120 is $3.5 \times 10^{12}$ cm$^{-2}$. In an embodiment, the doping layer 126 is delta-doped silicon according to known technique. In an embodiment, the doping layer 126 is modulation-doped silicon. In an embodiment, the doping layer 126 is combined delta-doped and modulation-doped. In an embodiment, the doping layer 126 is a silicon-modulation delta-doped layer having a thickness of 3 Å to 15 Å. In an NMOS device embodiment, doping of the doping layer 126 is implemented using silicon and teryllium (Te) impurities. In a PMOS device embodiment, doping of the doping layer 126 is with beryllium (Be). In a PMOS device embodiment, doping of the doping layer 126 is with carbon (C). In a PMOS device embodiment, doping of the doping layer 126 is with beryllium and carbon.

After formation of the doping layer 126, a top barrier layer 128 is formed to complete the device stack. In an embodiment, the top barrier layer 128 is an $In_xAl_{1-x}As$ barrier layer 128. According to an embodiment, the top barrier layer 128 has a thickness of between 1.5 nm and 6 nm. In an embodiment, the top barrier layer 128 has a thickness of between 1.5 nm and 6 nm. The top barrier layer 128 may be a Schottky barrier layer for gate control.

A device stack embodiment may be referred to the device stack 130, which includes a buffer bottom structure 132 that includes the nucleation layer 112 on the semiconductive substrate 110, the bottom buffer layer 114, the graded buffer layer 116, and the bottom barrier layer 118. The device stack 130 also includes a QW layer 134 that includes the QW layer 120 and the phenomenon of the 2DEG 121. The device stack 130 also includes the composite spacer 136 that includes the spacer first layer 122 and the spacer second layer 124. The device stack 130 also includes a semiconductive top structure 138 that includes the doped layer 126 and the top barrier layer 128. The device stack therefore includes the buffer bottom structure 132 on the semiconductive substrate 110, the QW layer 134, the composite spacer 136, and the semiconductive top structure 138.

After formation of the device stack 130, an etch stop layer 140 is formed over the top barrier layer 128. In an embodiment, the etch stop layer 140 is indium phosphide (InP). Other barrier materials may be used that may integrate with a given specific application rule. The etch stop layer 140 may have a thickness from 1.5 to 9 nm. In an embodiment, the etch stop layer 140 has a thickness of 6 nm.

The device stack 130 is further processed by forming a contact layer 142 above the etch stop layer 140. The contact layer 142 provides source- and drain contact structures with low contact resistance. In an embodiment, the contact layer 140 is formed of $In_xGa_{1-x}As$. For an NMOS device stack 130 the contact layer 142 is n+ doped. The contact layer 142 may also be n++ doped. In an embodiment, the contact layer 142 is doped by grading, starting with silicon doped with $In_{0.53}Ga_{0.47}As$, and proceeding from $In_xGa_{1-x}As$ from x=0.53 to 1.0 such that grading terminates with InAs. For a PMOS device stack 130, the contact layer 142 is p+ doped. In an embodiment, graded doping is done with a p+ doping gradient. The contact layer 142 has a thickness between 10 nm and 30 nm according to an embodiment. The contact layer 142 has a thickness of 20 nm according to an embodiment.

FIG. 1b is a cross-section elevation of the integrated circuit device depicted in FIG. 1a after further processing according to an embodiment. The integrated circuit device 101 has been processed by forming a gate recess 144 that has penetrated the contact layer 142, the etch stop layer 140, the top barrier layer 128, the silicon doping layer 126, and the spacer second layer 124. Processing includes forming a spacer 145 in the gate recess 144 for electrical insulation of the gate.

Further processing includes formation of a high-k gate dielectric film 146 and a gate contact 148. In an embodiment, the high-k gate dielectric film 146 has a thickness from 20 Å to 60 Å. The high-k gate dielectric film 146 is seated in a portion of the composite spacer 136 including resting upon the InP spacer first layer 122 without penetrating. In an embodiment, the high-k dielectric film 146 is hafnium oxide ($HfO_2$). In an embodiment, the high-k dielectric film 146 is alumina ($Al_2O_3$). In an embodiment, the high-k dielectric film 146 is tantalum pentaoxide ($Ta_2O_5$). In an embodiment, the high-k dielectric film 146 is zirconium oxide ($ZrO_2$). In an embodiment, the high-k dielectric film 146 is lanthanum aluminate ($LaAlO_3$). In an embodiment, the high-k dielectric film 146 is gadolinium scandate ($GdScO_3$). As used herein, the phrase "high-k" refers to materials having a dielectric constant, k, greater than that of silicon dioxide, that is, greater than about 4.

A gate contact 148 is formed above and on the high-k gate dielectric film 146. In an embodiment, the gate contact 148 is a titanium (Ti) material. In an embodiment, the gate contact 148 is a platinum (Pt) material. In an embodiment, the gate contact 148 is a gold (Au) material. In an embodiment, the gate contact 148 is a combination of at least two of titanium, platinum, and gold. In an embodiment, the gate contact 148 has a thickness from 60 Å to 140 Å. In and embodiment, the gate contact 148 has a thickness of 100 Å. In and embodiment, the high-k gate dielectric film 146 has a thickness of 100 Å and the gate contact 148 has a thickness of 100 Å.

Figure 2:
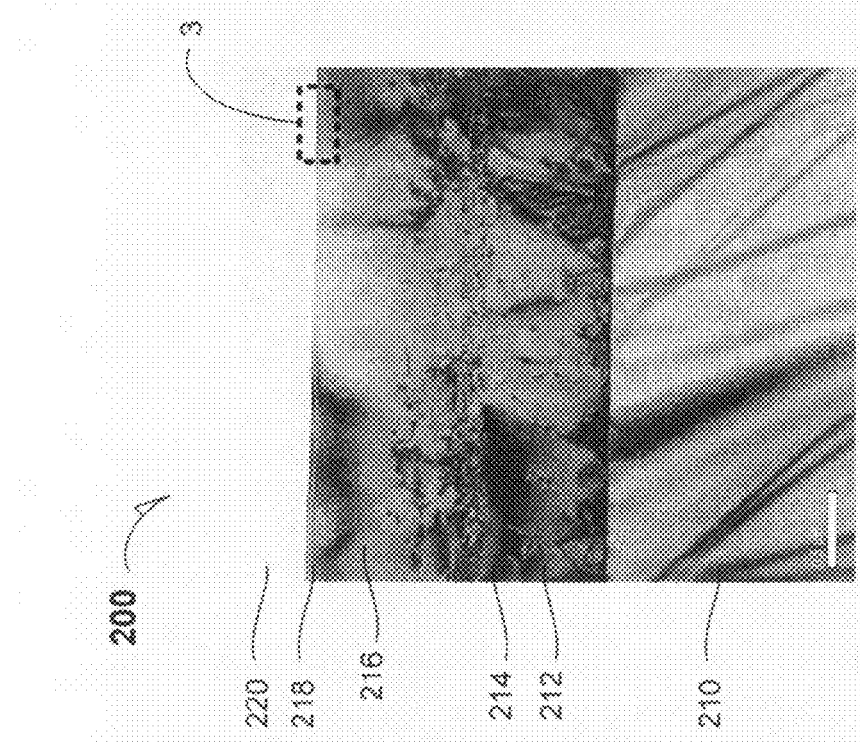
FIG. 2 is a computer-image rendition of a transistor stack depicted as a photomicrograph in elevational cross section according to an example embodiment.

A source contact 152 and a drain contact 154 are disposed above the contact layer 142. In an embodiment, the source contact 152 and drain contact 154 are the same material as the gate contact 150. In an embodiment, the source- and drain contact materials are non-alloyed layers. In an embodiment, the source- and drain contact materials are non-alloyed layers of gold (Au) deposited on germanium (Ge), which in turn is deposited on nickel (Ni) at the bottom. In an embodiment, the source- and drain contact materials are non-alloyed layers of gold (Au) deposited on platinum (Pt), which in turn is deposited on nickel (Ni) at the bottom FIG. 2 is a computer-image rendition of a transistor stack 200 depicted as a photomicrograph in elevational cross section according to an example embodiment. An integrated circuit device 200 may be used to form an NMOS or PMOS device on a semiconductive substrate 210. In an embodiment, the semiconductive substrate 210 is a high resistivity n- or p-type (100) off-oriented Si substrate.

A nucleation layer 212 and bottom buffer layer 214 were formed on the semiconductive substrate 210. In an embodiment, the nucleation layer 212 is made of gallium arsenide. In an embodiment, the nucleation layer is a 30 nanometer (nm) thick layer of GaAs, followed by the bottom buffer layer 214 that can be from 0.3 micrometer (μm) to 1 μm.

A graded buffer layer 216 was formed over the bottom buffer layer 214. In an embodiment, the graded buffer layer 216 is indium aluminium arsenide ($In_xAl_{1-x}As$). By forming the graded buffer layer 216, dislocations may glide along relatively diagonal planes therewithin. In an embodiment, the graded buffer layer 216 has a thickness between 0.5 and 2.0 μm. In an embodiment, the graded buffer layer 216 has a thickness of 0.8 μm.

A bottom barrier layer 218 was disposed above and on the graded buffer layer 216. In an embodiment, the bottom barrier layer 218 is formed of a higher bandgap material than what will be a QW layer 220 to be formed above and on the bottom barrier layer 218. In an embodiment, the bottom barrier layer 218 is made of an $In_{0.52}Al_{0.48}As$ composition. In an embodiment, the bottom barrier layer 118 has a thickness between 4 nm and 16 nm. In an embodiment, the bottom barrier layer 118 has a thickness of 10 nm.

Figure 3:
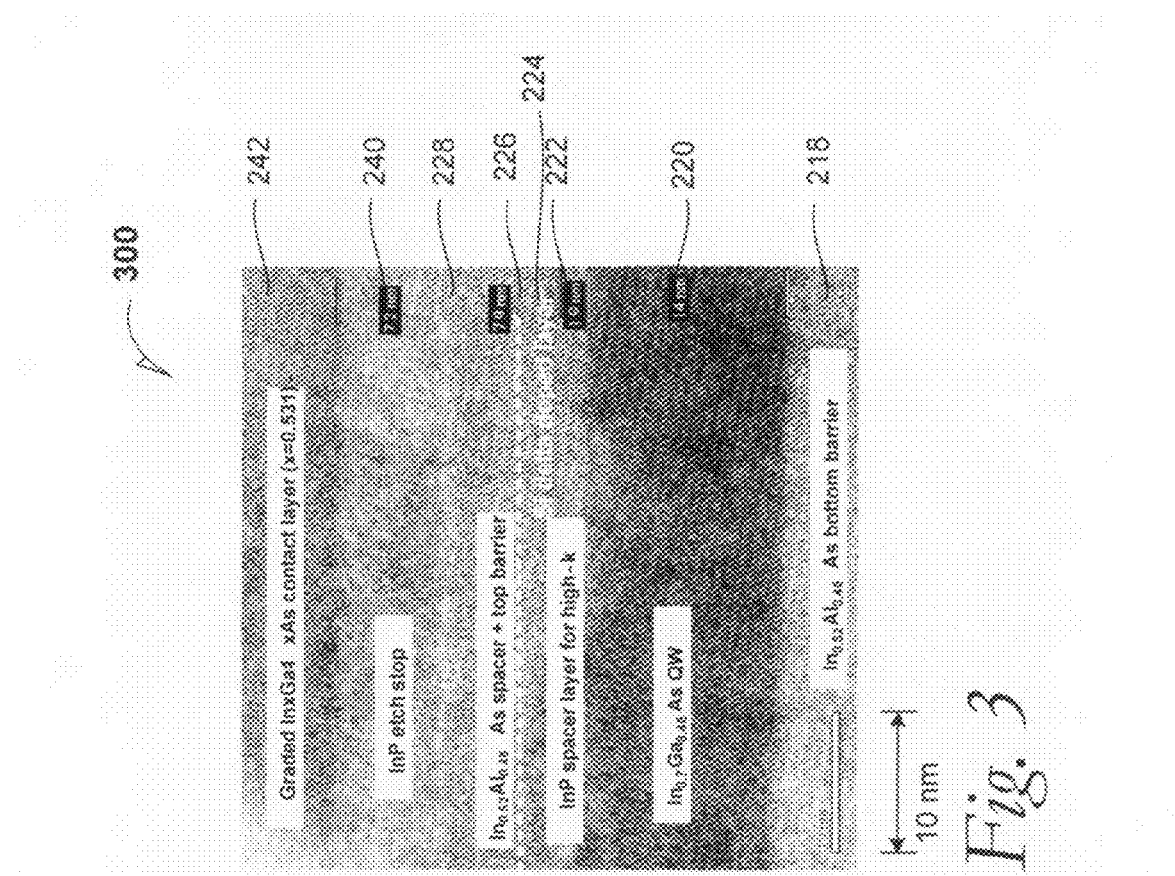
FIG. 3 is a detail section photomicrograph taken approximately from the section 3 depicted in FIG. 2.

FIG. 3 is a detail section microphotograph taken approximately from the section 3 depicted in FIG. 2. The microphotograph 300 illustrates a QW layer 220 that was formed of a material that has a smaller bandgap than that of the bottom barrier layer 218. In an embodiment, the QW layer 220 is formed of $In_xGa_{1-2}As$, where x equals between 0.53 and 0.8.

A composite spacer made of an InP spacer first layer 222 and an $In_{0.52}Al_{0.48}As$ spacer second layer 224 was formed over the QW layer 220. As further shown in FIG. 3, the composite spacer was formed over the QW layer 220. The composite spacer may provide for carrier confinement and reduced interaction between a doping layer and a two dimensional electron gas (2DEG) formed inside the channel of the QW layer 220. The composite spacer may also provide compressive strain to the QW layer 220 as it acts as a semiconductive channel. In an embodiment, the InP spacer first layer 222 has a thickness in a range from 0.5 nm to 4 nm.

A doping layer 226 is formed. In an embodiment, the contact layer 142 is doped by grading, starting with silicon doped with $In_{0.53}Ga_{0.47}As$, and proceeding from InxGa1-2As from x=0.53 to 1.0 such that grading terminates with InAs. In an embodiment, the doping layer 226 is delta-doped according to known technique. In an embodiment, the doping layer 226 is modulation-doped. In an embodiment, the doping layer 226 is combined delta-doped and modulation-doped. In an embodiment, the doping layer 226 is a silicon-modulation delta-doped layer having a thickness of 3 Å to 15 Å. In an NMOS device embodiment, doping of the doping layer 226 is implemented using silicon and teryllium (Te) impurities. In a PMOS device embodiment, doping of the doping layer 226 is with beryllium (Be). In a PMOS device embodiment, doping of the doping layer 226 is with carbon (C). In a PMOS device embodiment, doping of the doping layer 226 is with beryllium and carbon.

A top barrier layer 228 was formed to complete the device stack. In an embodiment, the top barrier layer 228 is an $In_{0.52}Al_{0.48}As$ barrier layer 228. According to an embodiment, the top barrier layer 228 has a thickness of between 1.5 nm and 6 nm. In an embodiment, the top barrier layer 228 has a thickness of between 1.5 nm and 6 nm. The top barrier layer 228 may be a Schottky barrier layer for gate control.

An etch stop layer 240 is formed over the top barrier layer 228. In an embodiment, the etch stop layer 240 is indium phosphide (InP). Other barrier materials may be used that may integrate with a given specific application rule. The etch stop layer 240 may have a thickness from 1.5 to 9 nm. In an embodiment, the etch stop layer 240 has a thickness of 6 nm. A contact layer 242 was formed above the etch stop layer 240 that may be a graded $In_xGa_{1-x}As$ material where x=0.53.

Accordingly in various embodiments, devices may be formed using a high electron mobility material to form high electron mobility transistors (HEMTs) having high speed and low power consumption. Such devices may have dimensions less than approximately 50 nm with a switching frequency of approximately 562 gigahertz (GHz). Such devices may be able to operate at between approximately 0.5-1.0 volts without significant reduction of drive current.

Figure 4:
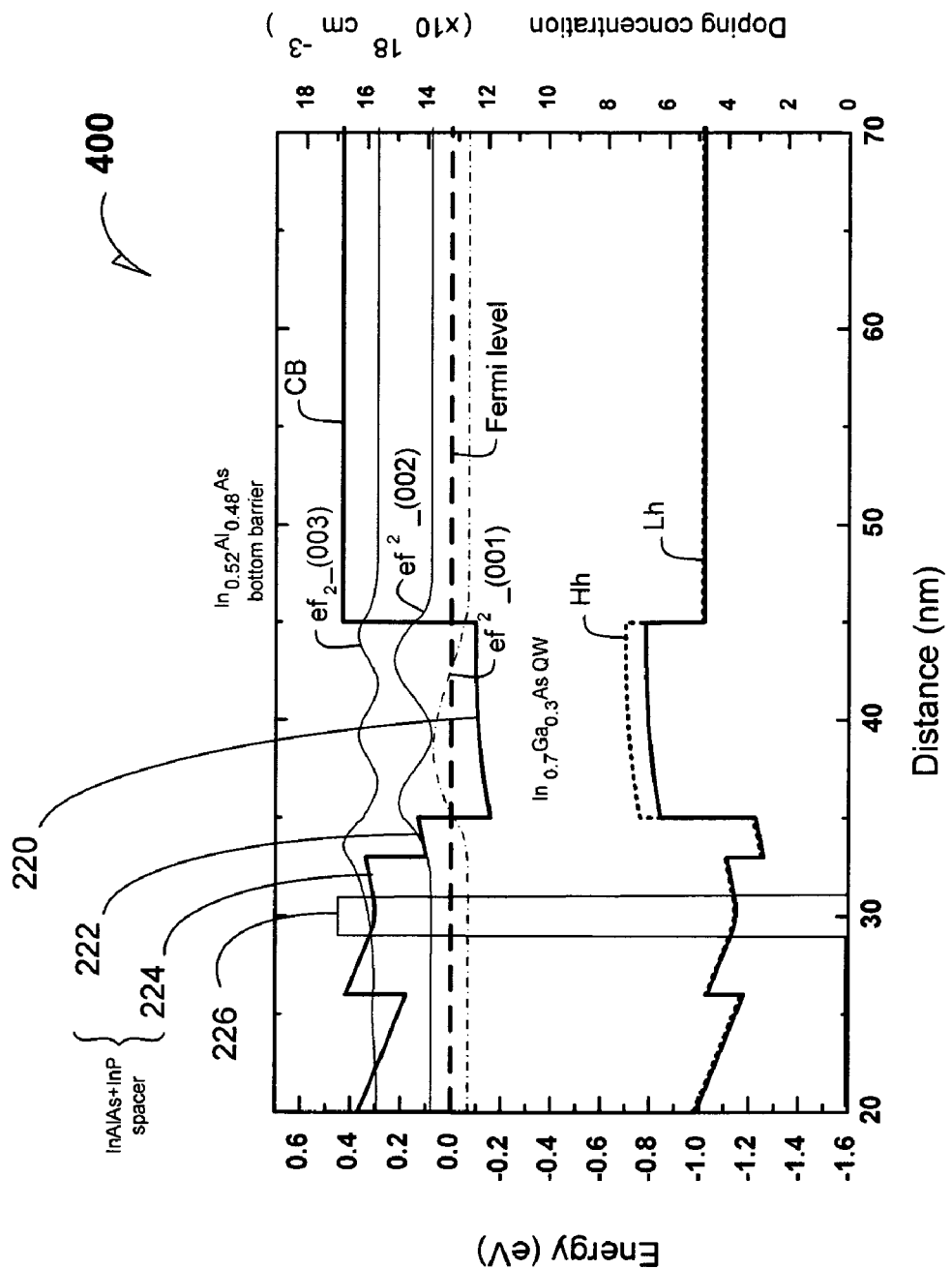
FIG. 4 is a band diagram of a transistor stack structure according to an embodiment.

FIG. 4 is a band diagram 400 of a structure in accordance with an embodiment. The band diagram 400 illustrates the Schrödinger-Poisson solution of spatial redistribution of a confined carrier population in various subbands in a QW layer such as the QW layer 234 at a gate voltage, $V_g$=0V. The band diagram 400 illustrates a conduction band at the top line (CB) and a lower line that is a valence band ($E_V$). Beginning at the right-hand side of FIG. 4, an off-cut silicon substrate on which a device stack is formed may have a band gap of approximately 1.4 electron volts (eV). A nucleation layer and a buffer layer are formed over the off-cut silicon substrate. The nucleation layer a buffer layer are formed of gallium arsenide. The nucleation layer and buffer layer have a higher band gap of approximately 1.42 eV. A graded buffer layer and a bottom barrier layer are made of indium aluminium arsenide to draw a balance between carrier confinement for a channel structure formed in a QW layer and relaxation.

The InP spacer first layer 222 (FIG. 3) does not cause conduction and carrier confinement issues on top of the InGaAs QW layer 220. The InP spacer first layer 222 allows the InAlAs spacer second layer 224 to be a higher step above the QW layer 220 that consequently allows for the high-k dielectric to be used. Further to the presence of the composite spacer, a higher charge and a higher carrier mobility is achievable. The effect of the doped silicon layer 226 is also represented in FIG. 4.

Figure 5:
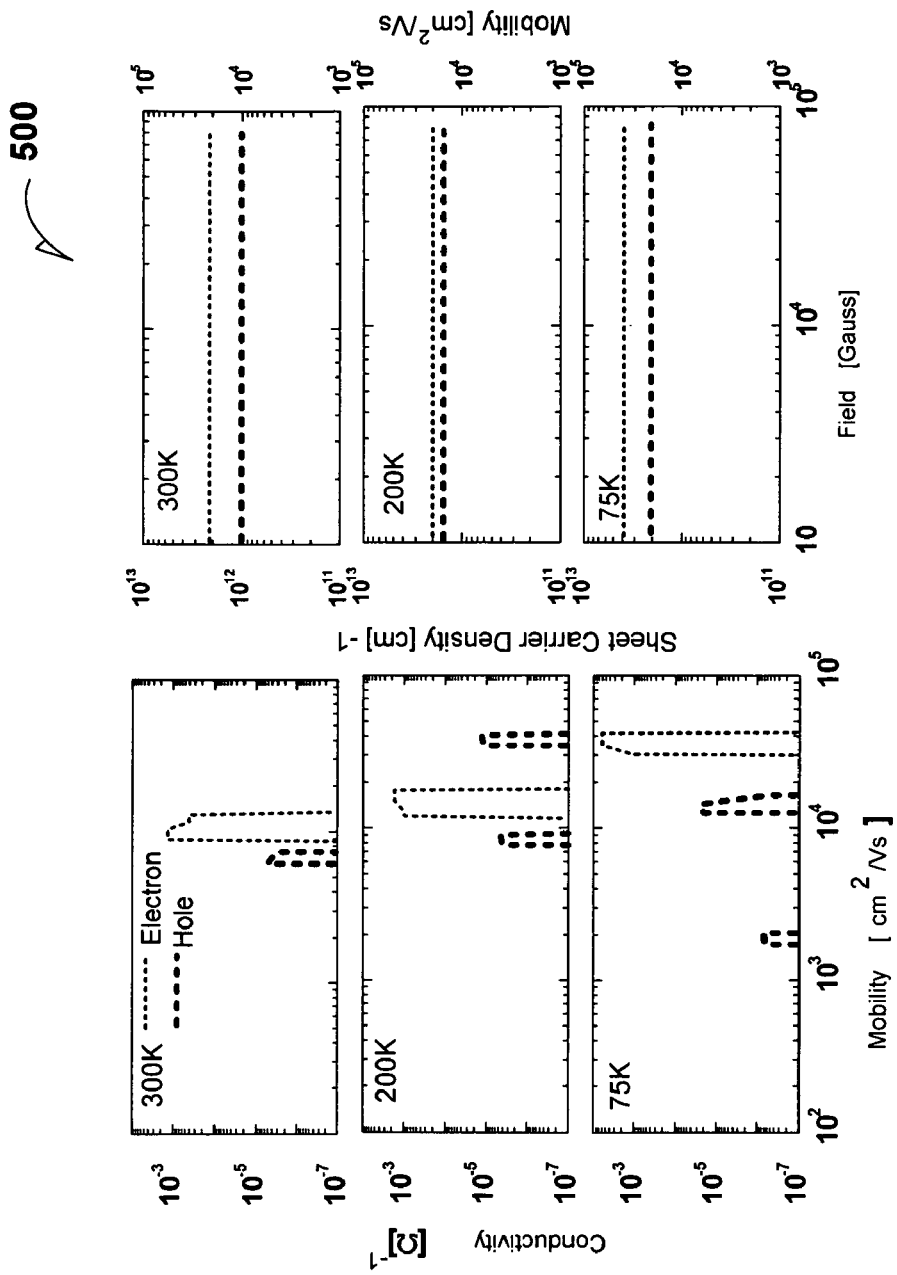
FIG. 5 represents temperature- and field-dependent mobility measurements of the InGaAs transistor stack on off-cut silicon that uses the InAlAs/InP composite spacer according to an embodiment.

FIG. 5 represents temperature- and field-dependent mobility measurements of the InGaAs transistor stack on off-cut silicon that uses the InAlAs/InP composite spacer according to an embodiment. The graphs on the left of FIG. 5 represent temperature-dependent carrier mobility according to an embodiment. It can be seen from the graphs on the left that electron mobility increases more than hole mobility as an inverse function of temperature. It can also be seen from the graphs on the right that magnetic field is substantially not affected as an inverse function of temperature. It is useful to have carrier conductivity higher. It is also useful to have quantum mobility as high as probable.

Figure 6:
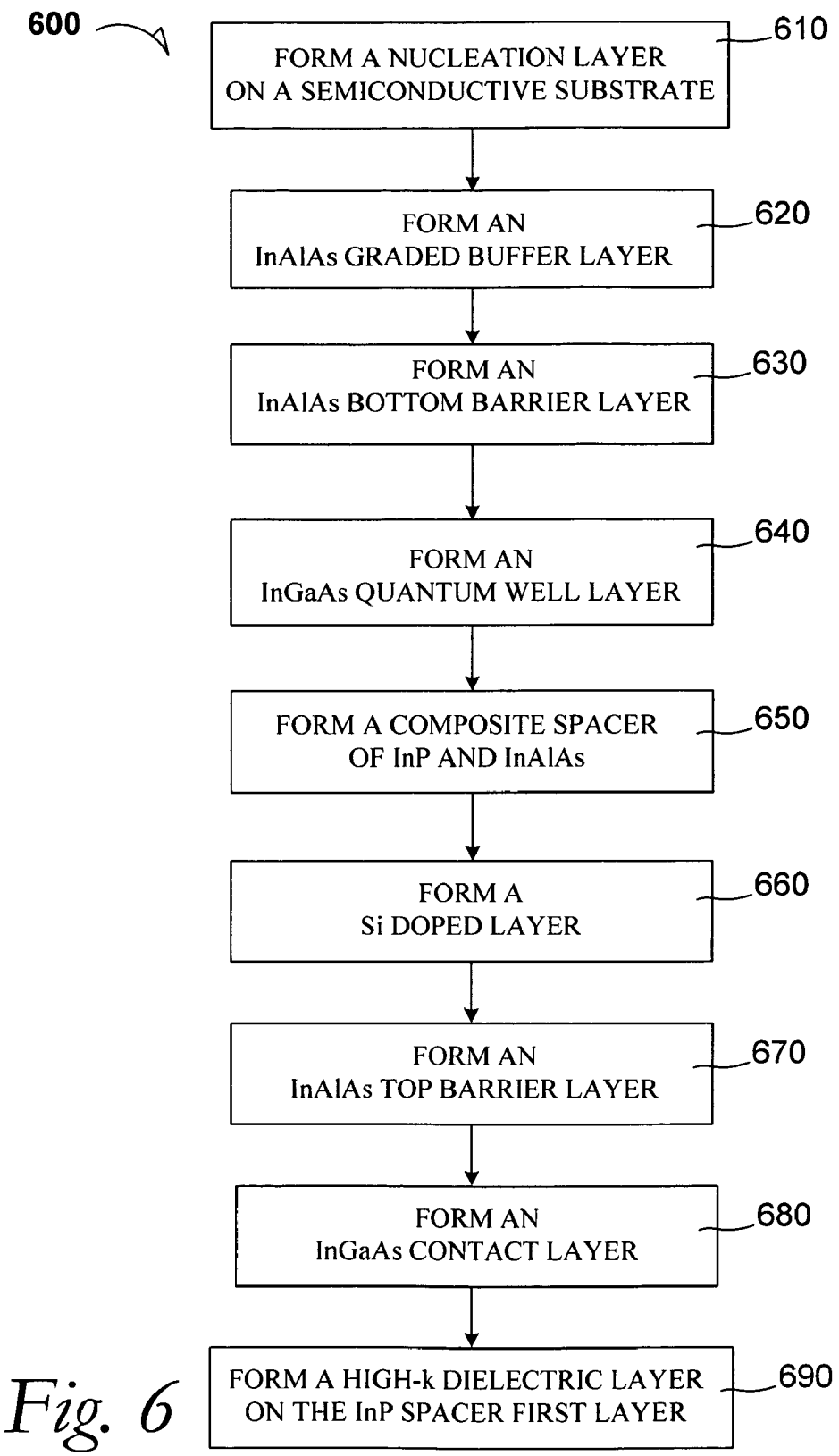
FIG. 6 is a process flow diagram according to an embodiment.

FIG. 6 is a process flow diagram according to an embodiment.

At 610, the process includes forming a nucleation layer on a semiconductive substrate. In a non-limiting example embodiment, the nucleation layer 112 is formed on the semiconductive substrate 110.

At 620, the process includes forming an InAlAs graded buffer layer. In a non-limiting example embodiment, the InAlAs graded buffer layer 116 is formed on the bottom buffer layer 114.

At 630, the process includes forming an InAlAs bottom barrier layer. In a non-limiting example embodiment, the bottom barrier layer 114 is formed on the nucleation layer 112.

At 640, the process includes forming an InGaAs QW layer on the InAlAs bottom barrier layer.

At 650, the process includes forming a composite spacer on the InGaAs QW layer. In a non-limiting example embodiment, an InP spacer first layer 122 and an $In_{0.52}Al_{0.48}As$ spacer second layer 124 are formed as the composite spacer that is disposed on the InGaAs QW layer. In an embodiment, the process commences at 610 and terminates at 650.

At 660, the process includes forming a doped silicon layer on the composite spacer 136. In a non-limiting example embodiment, a delta-doped silicon doping layer 126 is formed above the composite spacer 136.

At 670, the process includes forming an InAlAs top barrier layer on the doped silicon layer. In a non-limiting example embodiment, a top barrier layer 128 is formed on the silicon doping layer 126.

At 680, the process includes forming a contact layer on the top barrier layer.

At 690, the process includes forming a high-k dielectric layer on the InP spacer first layer.

Figure 7:
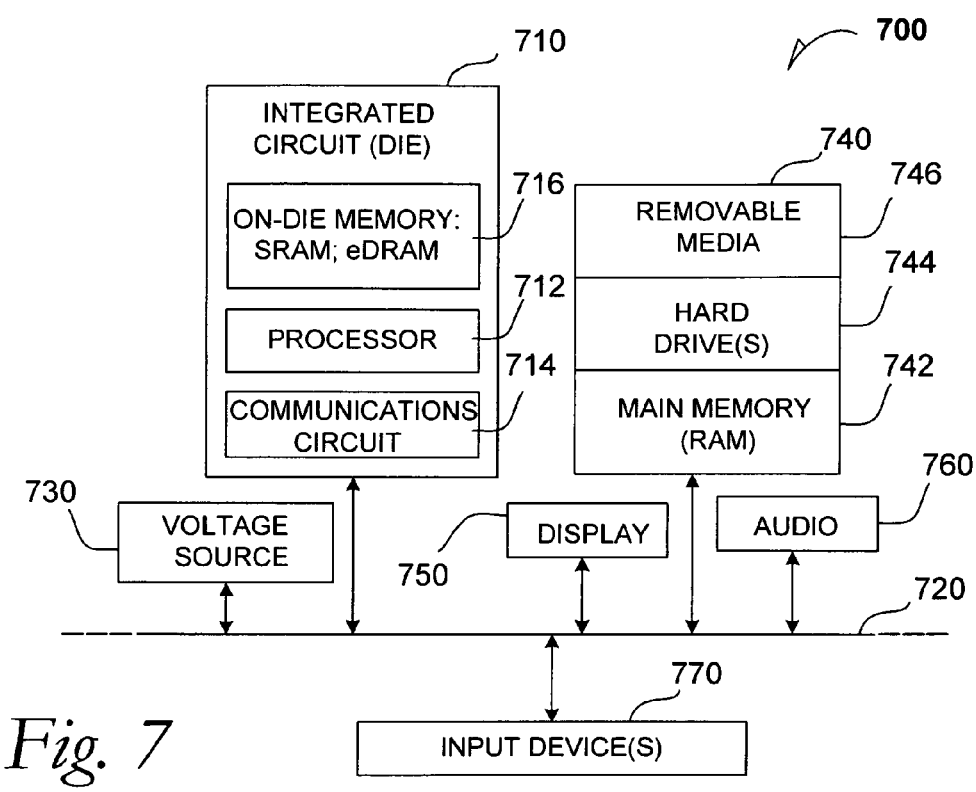
FIG. 7 is a schematic of an electronic system according to an embodiment.

FIG. 7 is a schematic of an electronic system 700 according to an embodiment. The electronic system 700 as depicted can embody composite spacer embodiments with high-k gate dielectric layer embodiments as set forth in this disclosure. In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. Other types of circuits that can be included in the integrated circuit 710 are a custom circuit or an application-specific integrated circuit (ASIC), such as a communications circuit 714 for use in wireless devices such as cellular telephones, pagers, portable computers, two-way radios, and similar electronic systems. In an embodiment, the processor 710 includes on-die memory 716 such as static random-access memory (SRAM). In an embodiment, the processor 710 includes embedded on-die memory 716 such as embedded dynamic random-access memory (eDRAM) that can be a cache memory for the processor.

In an embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory keys, and other removable media known in the art. The various memory functionalities can contain composite spacer embodiments with high-k gate dielectric layer embodiments.

In an embodiment, the electronic system 700 also includes a display device 750, an audio output 760. In an embodiment, the electronic system 700 includes a controller 770, such as a keyboard, mouse, trackball, game controller, microphone, voice-recognition device, or any other device that inputs information into the electronic system 700.

As shown herein, the integrated circuit 710 can be implemented in a number of different embodiments, including a composite spacer with a high-k gate dielectric layer, an electronic system, a computer system, one or more methods of fabricating an integrated circuit, and one or more methods of fabricating an electronic assembly that includes a composite spacer with a high-k gate dielectric layer as set forth herein in the various embodiments and their art-recognized equivalents. The elements, materials, geometries, dimensions, and sequence of operations can all be varied to suit particular composite spacers with a high-k gate dielectric layer embodiments.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A device comprising:
   a quantum well (QW) layer on a semiconductive substrate, wherein the semiconductive substrate includes a InAlAs bottom barrier below the QW layer, and wherein the quantum well includes an InGaAs composition;
   a composite spacer disposed upon the QW layer, including:
      an InP spacer first layer disposed above and on the QW layer; and
      an InAlAs spacer second layer disposed above and on the InP spacer first layer;
   a Si layer disposed above on the InAlAs spacer second layer; and
   an InAlAs top barrier disposed above and on the Si layer.

2. The device of claim 1, further including:
   an InP etch stop layer disposed above and on the InAlAs top barrier; and
   an InGaAs contact layer disposed above and on the InP etch stop layer.

3. The device of claim 1, further including:
   an InP etch stop layer disposed above and on the InAlAs top barrier; and
   an $In_xGa_{1-x}As$ (x=0.53 to 1.0) contact layer disposed above and on the InP etch stop layer.

4. The device of claim 1, further including: a high-k dielectric layer disposed in a recess and above and on the InP spacer first layer.

5. The device of claim 1, further including:
   a high-k dielectric layer disposed in a recess and above and on the InP spacer first layer; and
   a gate contact disposed on the high-k dielectric layer.

6. The device of claim 1, further including:
   an InP etch stop layer disposed above and on the InAlAs top barrier;
   an In GaAs contact layer disposed above and on the InP etch stop layer; and
   a high-k dielectric layer disposed in a recess and above and on the InP spacer first layer.

7. The device of claim 1, further including:
   an InP etch stop layer disposed above and on the InAlAs top barrier;
   an InGaAs contact layer disposed above and on the InP etch stop layer;
   a recess that stops above and on the InP spacer first layer;
   a high-k dielectric layer disposed in the recess and above and on the InP spacer first layer;
   a gate contact disposed on the high-k dielectric layer;
   a source contact disposed at the recess on the InGaAs contact layer on one side thereof;
   a drain contact disposed at the recess on the InGaAs contact layer on one side thereof.

8. A device comprising:
   a quantum well (QW) layer on a semiconductive substrate, wherein the semiconductive substrate includes a InAlAs bottom barrier below the QW layer, and wherein the quantum well includes an InGaAs composition;
   a composite spacer disposed upon the QW layer, including:
      an InP spacer first layer disposed above and on the QW layer; and
      an InAlAs spacer second layer disposed above and on the InP spacer first layer;
   a Si layer disposed above on the InAlAs spacer second layer;
   an InAlAs top barrier disposed above and on the Si layer;
   an InP etch stop layer disposed above and on the InAlAs top barrier;
   an $In_xGa_{1-x}As$ (x=0.53 to 1.0) contact layer disposed above and on the InP etch stop layer;
   a high-k dielectric layer disposed in a recess and above and on the InP spacer first layer; and
   a gate contact disposed on the high-k dielectric layer.

9. The device of claim 8, further including:
   a source contact disposed at the recess on the InGaAs contact layer on one side thereof;
   a drain contact disposed at the recess on the InGaAs contact layer on one side thereof; and
   wherein the QW layer is part of a transistor for a logic circuit.

10. The device of claim 8, further including:
    a source contact disposed at the recess on the InGaAs contact layer on one side thereof;
    a drain contact disposed at the recess on the InGaAs contact layer on one side thereof; and
    wherein the QW layer is part of a transistor for a memory circuit.

11. A process of forming a semiconductor device stack comprising:
    forming a buffer bottom structure on a semiconductive substrate;
    forming a quantum well (QW) layer above the buffer bottom structure;
    forming a composite spacer above the QW layer, wherein the composite spacer includes:
        an InP spacer first layer disposed above and on the QW layer; and
        an InAlAs spacer second layer disposed above and on the InP spacer first layer; and
    forming a semiconductive top structure above the composite spacer, wherein the buffer bottom structure includes a InAlAs bottom barrier, and wherein the semiconductive top structure includes an InAlAs top barrier layer.

12. The process of claim 11, wherein forming the buffer bottom structure includes:
    forming a GaAs nucleation layer on an offcut semiconductive substrate;
    forming a GaAs buffer layer on the GaAs nucleation layer;
    forming an InAlAs graded buffer layer on the GaAs buffer layer;
    forming the InAlAs bottom barrier layer on the InAlAs graded buffer layer.

13. The process of claim 11, wherein forming the QW layer above the buffer bottom structure includes forming an InGaAs layer on the InAlAs bottom barrier layer.

14. The process of claim 11, wherein forming the composite spacer above the QW layer includes:
    forming the InP spacer first layer on an forming an InGaAs QW layer; and
    forming the InAlAs spacer second layer disposed on the InP spacer first layer.

15. The process of claim 11, wherein forming the semiconductive top structure above the composite spacer includes:
    forming a silicon doped layer above and on the InAlAs spacer second layer; and
    forming the InAlAs top barrier layer on the silicon doped layer.

16. The process of claim 11, further including:
    forming an InP etch stop layer above and on the semiconductive top structure;
    forming an $In_xGa_{1-x}As$ (x=0.53 to 1.0) contact layer above and on the InP etch stop layer;
    forming a recess that stops at the InP spacer first layer;
    forming a high-k dielectric layer in the recess above and on the InP spacer first layer; and
    forming a gate contact on the high-k dielectric layer.

17. A computing system comprising:
    a die, wherein the die includes:
        a quantum well (QW) layer on a semiconductive substrate, wherein the semiconductive substrate includes a InAlAs bottom barrier below the QW layer, and wherein the quantum well includes an InGaAs composition;
        a composite spacer disposed upon the QW layer, including:
            an InP spacer first layer disposed above and on the QW layer; and
            an InAlAs spacer second layer disposed above and on the InP spacer first layer;
        a Si layer disposed above on the InAlAs spacer second layer;
        an InAlAs top barrier disposed above and on the Si layer;
        an InP etch stop layer disposed above and on the InAlAs top barrier;
        an $In_xGa_{1-x}As$ (x=0.53 to 1.0) contact layer disposed above and on the InP etch stop layer;
        a high-k dielectric layer disposed in a recess and above and on the InP spacer first layer; and
        a gate contact disposed on the high-k dielectric layer; and
    external memory coupled to the die.

18. The computing system of claim 16, wherein the computing system is part of one of a cellular telephone, a pager, a portable computer, a desktop computer, and a two-way radio.

* * * * *